(12) United States Patent
Chu

(10) Patent No.: US 6,284,659 B1
(45) Date of Patent: Sep. 4, 2001

(54) METHOD OF MINIMIZING DEFECT SOURCES INSIDE HIGH DENSITY PLASMA REACTOR

(75) Inventor: Shin-Kun Chu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/510,968

(22) Filed: Feb. 21, 2000

(51) Int. Cl.[7] ........................ H01L 21/302; H01L 21/461
(52) U.S. Cl. ............................ 438/690; 438/712
(58) Field of Search .................... 438/690, 712, 438/717, 725, 743, 4, 6, 130, 598; 156/345, 643

(56) References Cited

U.S. PATENT DOCUMENTS

| | | | |
|---|---|---|---|
| 4,902,638 | * | 2/1990 | Muto ......................... 438/4 |
| 5,846,373 | * | 12/1998 | Pirkle et al. ................ 156/345 |
| 6,077,386 | * | 6/2000 | Smith, Jr. et al. ............ 156/345 |
| 6,093,655 | * | 7/2000 | Donohoe et al. ............. 438/717 |

* cited by examiner

Primary Examiner—David Nelms
Assistant Examiner—Phuc T. Dang

(57) ABSTRACT

The present invention is used to minimize defect sources that are located inside a high density plasma reactor. The proposed invention is a method that comprises the following steps. First, numerous semiconductor processes are performed by the high density plasma reactor and a cumulative operating duration of the high density plasma reactor is recorded. Second, whenever the cumulative operating duration does not exceed a predetermined limitation, numerous semiconductor processes are continuously performed by the high density plasma reactor excesses. Third, whenever the cumulative operation duration exceeds the predetermined limitation, operation of the high density plasma reactor is stopped and a cycle purge process is performed to minimize the quantity of defect sources inside the high density plasma reactor. The so-called cycle purge process comprises the following basic steps. First, the high density plasma reactor is filled by a cleaning gas. Second, the cleaning gas is pumped out of the high density plasma reactor, wherein some defect sources inside the high density plasma reactor are carried out with the cleaning gas. Incidentally, after the so-called cycle purge process is finished, the cumulative operating duration is reset to zero and then the first step of the method of the present invention is performed again.

12 Claims, 2 Drawing Sheets

METHOD OF MINIMIZING DEFECT SOURCES INSIDE HIGH DENSITY PLASMA REACTOR

BACKGROUND OF THE INVENTION

1. Field of the Invention

This invention relates to a method for minimizing defect sources that are located inside a high density plasma reactor. Particularly, the present invention relates to a method for cleaning the high density plasma reactor by a cycle purge process in which defect sources are clean up by gas.

2. Description of the Prior Art

Currently, the high density plasma reactor has become an important piece of equipment for high density plasma provides an efficient way to overcome many disadvantages of both conventional chemical vapor deposition (CVD) and conventional physical vapor deposition (PVD) process. Further, owing to the fact that the reaction of high density plasma process comprises both depositing reaction and etching reaction at the same time, it is natural that high density plasma also provides an efficient way of performing the etching process.

However, because the density of high density plasma is larger than both conventional CVD and conventional PVD, the quantity of defect sources inside the high density plasma reactor is larger than that of a conventional reactor. Significantly, because the etching process will remove something from the wafer, the quantity of defect sources is further increased. Thus, when a high density plasma reactor is used to continuously process numerous wafers or to continuouly perform numerous processes, the risk that the reactor is contaminated by defect sources cannot be neglected.

A practical example is the high density plasma etcher that is used to perform a W (tungsten) etching back process. Whenever numerous wafers are processed in regular order, it is unavoidable that defect sources continuouly accumulated and some defect sources will drop on top of the surface of the wafer. In other words, some invidual external defects are formed on the wafer, and according to practical experience, these external defects are inclined to collect at the center of the wafer.

Therefore, in order to enhance the practicality of high density plasma, it is desired for a method of cleaning the high density plasma reactor is to eliminate (or at least minimize) the risk of defects. Furthermore, in order not to degrade performance of the high density plasma, the required method should not be accomplished by changing the parameters of high density plasma such as density, temperature and so on.

SUMMARY OF THE INVENTION

A primary object of the present invention is to provide a method for minimizing defect sources inside a high density plasma reactor, especially the high density plasma etcher.

A concrete object of the invention is to provide a method that enhances performance of high density plasma without any modification on parameters of high density plasma.

A further object of the invention is to overcome an the obvious disadvantages of the conventional high density plasma reactor where the quality of the wafer is degraded by unavoidable external defects.

Another object of this invention is to provide a practical and simple method to minimize defects that are induced by high density plasma.

First preferred embodiment is a method of minimizing defect sources inside a high density plasma reactor. The present method comprises the following steps. First, numerous semiconductor processes are performed by the high density plasma reactor and a cumulative operating duration of the high density plasma reactor is recorded. Second, whenever the cumulative operating duration does not exceed a predetermined limitation, numerous semiconductor processes are continuously performed by the high density plasma reactor excesses. Third, whenever the cumulative operation duration exceeds the predetermined limitation, operation of the high density plasma reactor is stopped and a cycle purge process is performed to minimize the quantity of defect sources inside the high density plasma reactor. The so-called cycle purge process comprises following basic steps. First, the high density plasma reactor is filled by a cleaning gas. Second, the cleaning gas is pumped out of the high density plasma reactor, wherein some defect sources inside the high density plasma reactor are carried out with the cleaning gas. After the so-called cycle purge process is finished, the cumulative operating duration is reset to zero and the first step of the method of the present invention is performed again.

Another preferred embodiment of the present invention is a method of cleaning a high density plasma etcher. The embodiment comprises two essential steps. First, the high density plasma etcher is filled by a cleaning gas. Second, the cleaning gas is pumped out of the high density plasma etcher, wherein numerous defect sources that arise inside the high density plasma etcher are carried out with the cleaning gas.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings in which.

DESCRIPTION OF THE PREFERRED EMBODIMENT

The first preferred embodiment of the present invention is a method of minimizing defect sources inside a high density plasma reactor. A particular application of the preferred embodiment is a method of cleaning a high density plasma reactor by gas.

Figure 1:
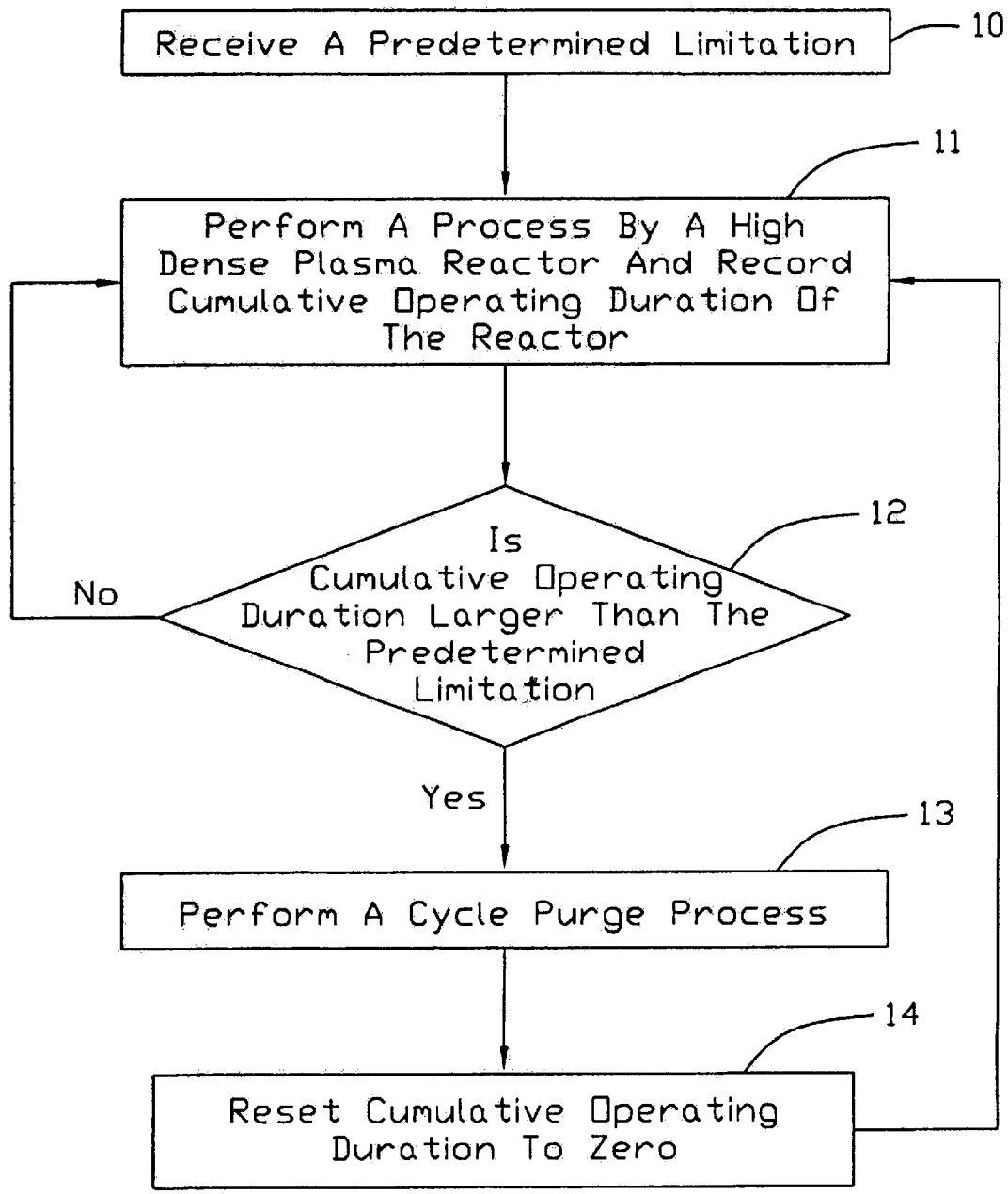
FIG. 1 is a flowchart of one preferred embodiment of the invention.

As the essential flowchart of FIG. 1 illustrates, the present method comprises the following steps. First of all, the receive block 10 receives a predetermined limitation that is provided by the operator of the high density plasma reactor. Perform block 11 performs a semiconductor process by the high density plasma reactor and records a cumulative operating duration of the high density plasma reactor. Then, as whether block 12 shows, the next step is to decide whether the cumulative operating duration is larger than the predetermined limitation. When the answer is negative, it is not necessary to clean the reactor right now and the steps of both perform block 11 and whether block 12 are repeated again until the answer is positive. By contrast, when the answer is positive, as cycle purge block 13 shows, the current operation of the reactor is stopped and a cycle purge process is performed to minimize defect sources inside the high density plasma reactor. Then as reset block 14 shows, the cumulative operating duration is reset to zero and the steps of both perform block 11 and whether block 12 are repeated again.

In summary, whenever the cumulative operating duration does not exceed the predetermined limitation, numerous semiconductor processes are continuously performed by the high density plasma reactor. Whenever the cumulative operation duration really exceeds the predetermined limitation, the operation of the high density plasma reactor is stopped and a cycle purge process is performed to minimize defect sources inside the high density plasma reactor.

Moreover, the cycle purge process at least includes the following steps. First, the high density plasma reactor is filled by a cleaning gas. Second, the cleaning gas is pumped out of the high density plasma reactor, wherein some defect sources inside the high density plasma reactor are carried out with the cleaning gas.

In addition, the so-called semiconductor processes each consist essentially of an etching process, and especially the etching back process. A typical predetermined limitation is about 100 hours. Further, according to the practical production line, the cycle purge process can efficiently minimize so-called external defects on the wafer, and a typical reducing ratio is about 80 percent. Moreover, the available cleaning gas comprises nitrogen gas and the cleaning gas is filled to let the pressure inside the high density plasma reactor adjust to about one atmosphere of pressure.

Significantly, because the predetermined limitation is adjusted, it is possible to balance the requirement of minimizing defect sources by increasing the frequency of cycle purge process and the requirement of increasing output of high density reactor by decreasing the frequency of the cycle purge process. Besides, owing to the fact that defect sources are cleaned by the gas purge when no semiconductor process is performed inside the reactor, all parameters of high density plasma are not adjusted and then performance of high density plasma is not degraded by the present embodiment.

Figure 2:
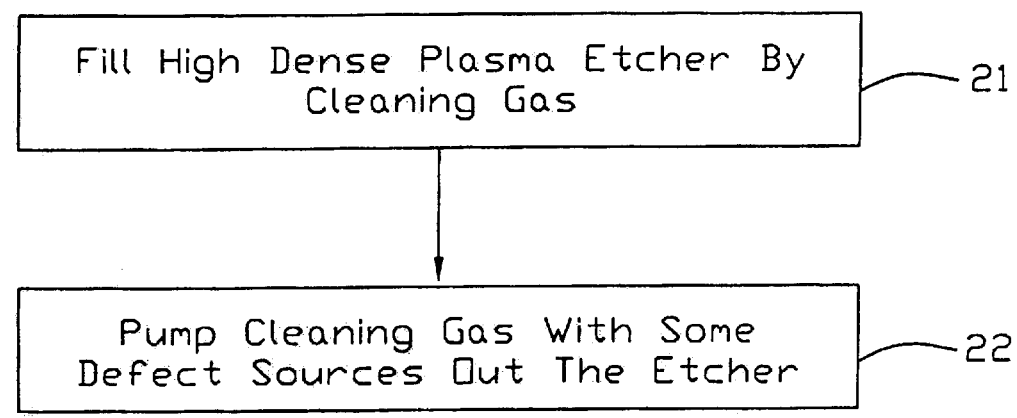
FIG. 2 is a flowchart of another preferred embodiment of the invention.

Another preferred embodiment is a method of cleaning a high density plasma etcher. As the flowchart shows in FIG. 2, the preferred embodiment comprises the following two essential steps. First, as fill block 20 shows, the high density plasma etcher is filled by a cleaning gas. And second, as clean block 21 shows, the cleaning gas is pumped out of the high density plasma etcher, wherein numerous defect sources that are inside the high density plasma etcher are carried out with the cleaning gas.

Without question, the second preferred embodiment is a special application of the first preferred embodiment for only an etcher is included. And specially, according to practical experience of the production line, the embodiment is more useful for cleaning these defect sources that are inside an etcher when the high density plasma tungsten etching back process is performed.

Incidentally, in order to prevent unexpected pollution, available kinds of cleaning gas comprise nitrogen gas and inert gas. Besides, it is usual for the cleaning gas to be filled to let the pressure inside the high density plasma etcher adjust to about one atmosphere of pressure. When the cleaning gas is pumped, it usually is pumped to a vacuum to make sure that no defect sources remain.

Obviously, numerous additional modifications and variations of the present invention are possible in light of the above teachings. It is therefore to be understood that within the scope of the appended claims, the invention may be practiced otherwise than as specifically described herein.

What is claimed is:

1. A method of minimizing defect sources inside a high density plasma reactor, said method comprising the steps of:
    performing a plurality of semiconductor processes by a high density plasma reactor and recording a cumulative operating duration of said high density plasma reactor; and
    when said cumulative operating duration excesses a predetermined limitation:
        terminating operation of said high density plasma reactor;
        performing a cycle purge process to minimize quantity of a plurality of defect sources inside said high density plasma reactor, wherein said cycle purge process comprises following steps:
            filling said high density plasma reactor by a cleaning gas such that said defect sources are purged by said cleaning gas; and
            pumping said cleaning gas with said defect sources out said high density plasma reactor; and
        resetting said cumulative operating duration to zero.

2. The method according to claim 1, wherein said semiconductor processes comprise etching process.

3. The method according to claim 1, wherein said semiconductor processes comprises tungsten etching back process.

4. The method according to claim 1, wherein said predetermined limitation is provided by an operator of said density plasma reactor.

5. The method according to claim 1, wherein a typical value of said predetermined limitation is about 100 hours.

6. A method of minimizing defect sources inside a high density plasma reactor, said method comprising the steps of:
    performing a plurality of semiconductor processes by a high density plasma reactor and recording a cumulative operating duration of said high density plasma reactor; and
    when said cumulative operating duration excesses a predetermined limitation:
        terminating operation of said high density plasma reactor;
        performing a cycle purge process with a cleaning gas to minimize quantity of a plurality of defect sources inside said high density plasma reactor by filling and pumping said cleaning gas, wherein available varieties of said cleaning gas comprise nitrogen and inert gas; and
        resetting said cumulative operating duration to zero.

7. The method according to claim 6, wherein said cleaning gas comprises nitrogen gas.

8. The method according to claim 6, wherein said cleaning gas comprises inert gas.

9. The method according to claim 6, wherein said cleaning gas is filled to let the pressure inside said high density plasma reactor is about one atmospheric pressure.

10. A method of cleaning a high density plasma etcher, said method comprising:
    filling said high density plasma etcher by a cleaning gas such that a plurality of defect sources inside said high density plasma etcher are purged by said cleaning gas; and
    pumping said cleaning gas out said high density plasma etcher, wherein said defect sources inside said high density plasma etcher are carried out with said cleaning gas.

11. The method according to claim 10, wherein available varieties of said cleaning gas comprise nitrogen gas and inert gas.

12. The method according to claim 10, wherein said cleaning gas is filled to let the pressure inside said high density plasma etcher is about one atmospheric pressure.

* * * * *